INVENTORS
KATSUO SATO
TOSHIAKI IRIE
BY
Hopgood & Calimafde
ATTORNEYS

INVENTORS
KATSUO SATO
TOSHIAKI IRIE
BY
Hopgood & Calimafde
ATTORNEYS

United States Patent Office 3,304,595
Patented Feb. 21, 1967

3,304,595

METHOD OF MAKING A CONDUCTIVE CONNECTION TO A SEMICONDUCTOR DEVICE ELECTRODE

Katsuo Sato and Toshiaki Irie, Tokyo, Japan, assignors to Nippon Electric Company Limited, Tokyo, Japan, a corporation of Japan Filed Nov. 19, 1963, Ser. No. 324,653
Claims priority, application Japan, Nov. 26, 1962, 37/53,080
3 Claims. (Cl. 29—25.3)

Figure 1A:
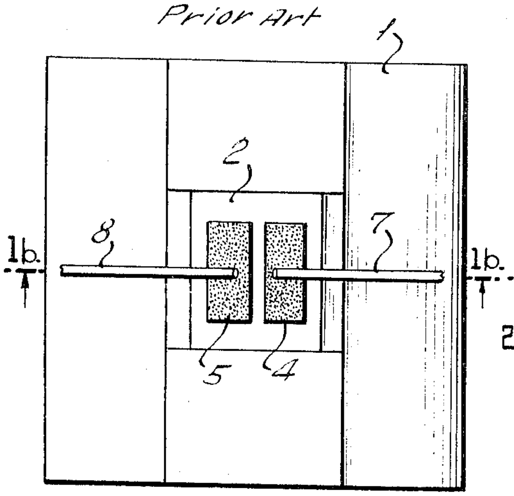
Fig. 1a. Prior Art

This invention relates to the manufacture of semiconductor devices and more particularly to such devices having characteristics which make them suitable for use at relatively high frequencies.

In order that a semiconductor device may be satisfactory for use at high frequencies, it is of course necessary that it possess certain electrical characteristics at these frequencies. Thus, for example, such a semiconductor should be capable of providing suitable power amplification, current amplification, cut-off frequency, and other properties. In the light of the design requirements of these high-frequency characteristics, the sizes of the emitter and base electrodes of, for example, transistors, have necessarily been reduced, and hence connection of these electrodes and their lead wires has become extremely difficult, making it highly impracticable to mass produce such transistors.

As transistors for cut-off frequencies of about 1,000 mc., germanium mesa-type constructions have most often been employed, usually with base and emitter electrode areas each of 0.025 mm. x 0.050 mm., and with an interelectrode distance of approximately 0.015 mm. For fitting lead wires to these electrodes, usually a thermo-compression bonding process is used. The lead wires are required to have an outside diameter of approximately 0.0125 mm. in view of the necessity of keeping the wires from contacting any part other than the electrodes, and for other reasons. As a result, the lead wire connecting operation calls for a high degree of technical skill and expensive precision thermo-compression bonding apparatus.

With transistors for higher cut-off frequencies, e.g. of the order of 3,500 mc., the design requirements limit the areas of the base and emitter electrodes to approximately 0.0075 mm. x 0.0375 mm. For such transistors, lead wires with a diameter of 0.0125 mm. are no longer adequate, and still finer ones are necessary. The miniature dimensions aggravate the difficulties of connection of the lead wires to the electrodes, and even handling of the lead wires themselves precludes the possibility of quantity production of the semiconductor devices.

Accordingly, it is an object of this invention to make it feasible to mass produce semiconductor devices which are capable of operation at frequencies significantly higher than such devices which are presently manufactured by mass production techniques.

Another object of this invention is to eliminate the difficulties now encountered in connecting very small diameter lead wires to the electrodes of extremely small semiconductor devices.

A further object is to provide an improved method for making semiconductor devices of extremely small size.

A still further object is to provide a very small semiconductor device of improved construction.

One feature of the present invention is that lead wires are not connected directly to the electrodes of a semiconductor element but are fitted to a conductive layer which is formed over a layer of insulating material which covers an entire surface of the element including the junctions and electrodes, said conductive layer partly overlapping with the electrodes, and that the electrodes and the conductive layer are connected together with the aid of thin needles or wedges pierced from above the conductive layer through the insulating layer to the electrodes.

A further feature of the invention is that the conductive layers facilitate connection of the electrodes with lead wires connected to the conductive layers, in a manner so that even if a part of a lead wire projects beyond the conductive layer, it will be prevented by the presence of the insulating layer from directly contacting with any other portion of the element, thus facilitating mass production of the semiconductors.

A still further feature of the invention lies in the use of an insulating layer over the semiconductor element surface which satisfies requirements for chemical stability of the surface of the element, including the junctions. This enables semiconductors to operate without being placed in hermetically sealed enclosures which in turn makes it possible to minimize the overall size of the device compared with those contained in such enclosures.

All of the objects, features and advantages of this invention and the manner of attaining them will become more apparent and the invention itself will be best understood by reference to the following description of an embodiment of the invention taken in conjunction with the accompanying drawing, in which—

Figure 1B:
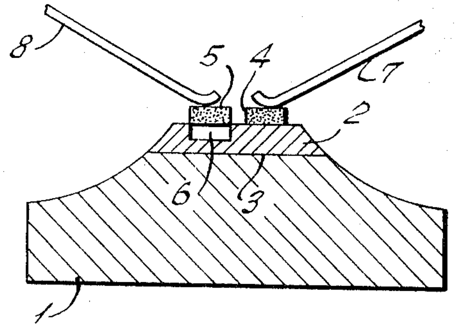
Fig. 1b. Prior Art

FIG. 1*a* is a top view of a typical semiconductor device known to those knowledgeable in the art, FIG. 1*b* is a vertical sectional view taken along the line 1*b*—1*b* of FIG. 1*a*.

Figure 2A:
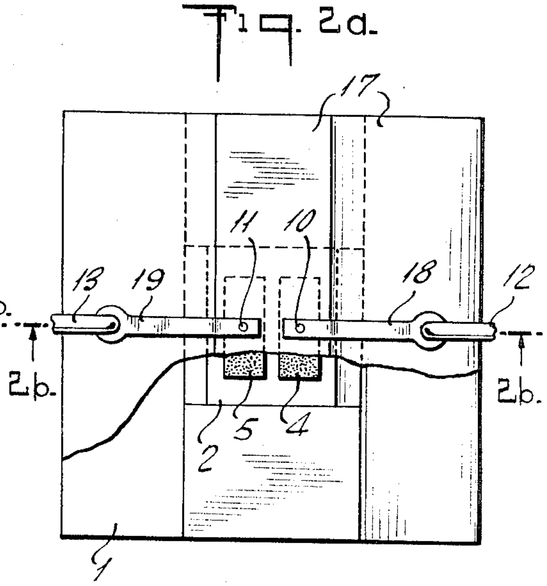
Figure 2B:
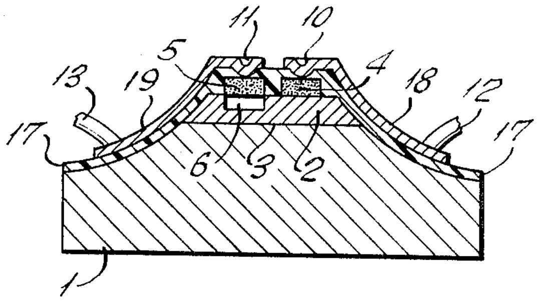

FIG. 2*a* shows a top view of a semiconductor device which embodies the teachings of this invention, FIG. 2*b* is a vertical sectional view taken along the line 2*b*—2*b* of FIG. 2*a*.

Figures 3A, 4A:
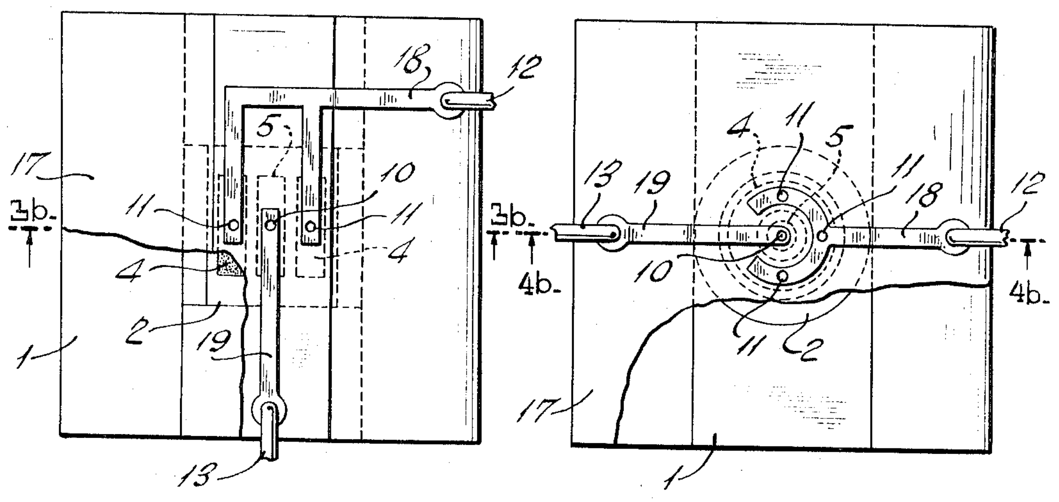
Figures 3B, 4B:
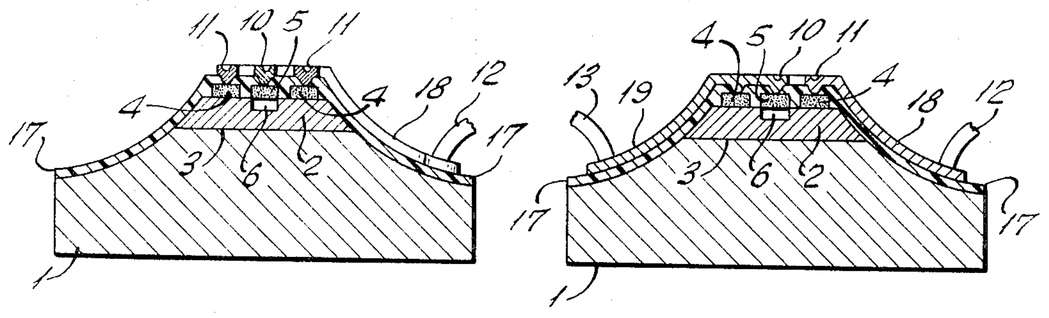

FIG. 3*a* shows a top view of a further embodiment of the invention,

FIG. 3*b* is a vertical sectional view taken along the line 3*b*—3*b* of FIG. 3*a*.

FIG. 4*a* shows a top view of a still further embodiment of the invention, and

FIG. 4*b* is a vertical sectional view taken along the line 4*b*—4*b* of FIG. 4*a*.

Referring now to FIGS. 1*a* and 1*b* there is shown a typical germanium mesa-transistor which employs lead wires secured by a conventional process. In these figures the numeral 1 indicates a semiconductor collector region, 2 a base region, 3 a collector-base junction, 4 a base electrode, 5 an emitter electrode, 6 an emitter region, and 7 and 8 lead wires directly connected to the electrodes 4 and 5 respectively. According to the conventional process employed, if the base electrode 4 and the emitter electrode 5 are to be reduced in size, the lead wires 7 and 8 must be of correspondingly smaller diameter, and joining of the lead wires becomes extremely difficult. By way of example, if the dimensions of the base and emitter electrodes 4 and 5 are approximately 0.025 mm. x 0.050 mm., the diameter of the lead wires 7 and 8 should be 0.0125 mm., which results in a corresponding decrease in mechanical strength.

FIGS. 2*a* and 2*b* show a germanium mesa-transistor which embodies the principles of this invention, thereby eliminating the disadvantages described above. In FIGS. 2*a* and 2*b*, like numerals 1 through 6 indicate corresponding parts as in FIGS. 1*a* and 1*b*, and the process of manufacture to the point of formation of the base electrode 4, the emitter electrode 5 and the emitter region 6 is identical with that described in connection with FIGS. 1*a* and 1*b*, however there are significant differences in the subsequent steps of manufacture.

Still referring to FIGS. 2*a* and 2*b*, the numeral 17 denotes a layer of insulating material formed over the entire surface of the element including the base electrode 4, the emitter electrode 5, and the collector-base junction 3. The insulating layer 17 is intended not only for electrical insulation between the conductive layers 18 and 19 formed thereon and the element surface, but simultaneously for accomplishment of chemical stabilization of the element surface.

For formation of the insulating layer 17 referred to above, usually a thin film of silicon oxide has been formed over the semiconductor wafers prior to formation of the electrodes. In such a conventional process, however, the thin film of silicon oxide once formed over the wafers must be partially removed to thereby provide spaces for the electrodes. To remove the silicon oxide film, photographic etching and other processes are variously employed. However, serious difficulties are presented in removing the film in sizes as small as 0.025 mm. x 0.050 or 0.0075 mm. x 0.0375 mm. as mentioned above.

According to the present invention, the semiconductor wafer is not provided initially with an insulating layer, but is provided first with electrodes 4 and 5 by vacuum coating or other suitable process, and then the insulating layer 17 is applied.

The emitter electrode 5 of the germanium mesa-transistor is made of aluminum and the base electrode 4 is preferably of a noble metal such as gold or a noble metal alloy and therefore it is desirable that the insulating layer 17 be formed at a temperature lower than the alloying temperature of the metals which constitute the emitter and the base electrodes. Consequently, vacuum coating, sputtering, electron-beam bombardment, or other film-forming techniques which do not require highly elevated temperatures for the semiconductor element are preferred. Moreover, the material of the insulating layer 17 consists of silicon monoxide and silicon oxide so as to satisfy the requirements for chemical stability of the surface of the element including those of the electrodes 4 and 5 and collector-base junction 3, and has a thickness of about 0.001 mm., thereby to minimize the floating capacity between the collector and the base and to facilitate subsequent connection of the conductive layers and electrodes.

After formation of the insulating layer 17 by the process as described above, the conductive layers 18 and 19 are formed thereon in such manner that portions thereof overlap with the electrodes. In other words, the conductive layer 18 partially overlies the base electrode 4, and the conductive layer 19 partially overlies the emitter electrode 5.

The conductive layers 18 and 19 are formed preferably of aluminum, silver, gold or the like, by vacuum coating technique, sputtering, or other film-forming techniques. The dimensions and shapes of the layers are governed by the required characteristics of the semiconductor device.

One end of each of the conductive layers 18 and 19 is enlarged in size to facilitate connection with lead wires 12 and 13 respectively. The conductive layers 18 and 19 so formed are isolated from the electrodes 4 and 5 of the semiconductor element by the insulating layer 17. Accordingly, the conductive layers must be electrically connected with the electrodes 4 and 5 by some means. An important feature of the present invention lies in the manner of providing these connections.

Connection of the base electrode 4 to the conductive layer 18 is accomplished by pressing the portion 10 downward in the region where they overlap with each other, preferably with a tool such as a thin needle or wedge, for example of sapphire, tungsten carbide or the like. By simultaneously depressing the portions of the conductive layer 18 and the insulating layer 17 in contact with the point of the needle or wedge, and sinking the same into the base electrode 4, the insulating layer 17 is pierced by the area of the point of the needle or wedge, to allow contact of the end of the conductive layer 18 with the base electrode 4, as seen in FIG. 2*b*. The needle or wedge is then removed. It will be appreciated that the base electrode 4 should be composed of soft metal, and that the shape and dimensions of the needle or wedge depend on the size of the base electrode 4. In order to improve the adhesion of the conductive layer 18 to the base electrode 4, it is desirable to heat the semiconductor element, preferably to approximately 280–310° C. Ultrasonic welding may also be employed for this purpose. It is also possible to provide a good connection without heating, by tucking the end of the layer 18 under the insulating layer 17 whereby contact between the edge of layer 18 and the electrode 4 will be maintained by the insulating layer 17. Alternatively, extremely small wedges or tacks may be employed to make a tack connection from the layer 18 to the soft electrode 4, the tack of course remaining in place. The conductive layer 19 and the emitter electrode 5 are connected at the portion 11 in a like manner as above.

The dimensions of the ends of the conductive layers 18 and 19 are suitably enlarged during formation thereof to facilitate connection with the lead wires 12 and 13 respectively. As an example, if the areas of the base electrode 4 and the emitter electrode 5 are each 0.025 mm. x 0.05 mm., the ends of the conductive layers 18 and 19 can each be enlarged to a diameter of about 0.050 mm., which permits connection thereof with lead wires having a diameter of 0.025–0.050 mm. This structure and the manner of fixing the lead wires are far more advantageous than the conventional techniques illustrated in FIG. 1, according to which the maximum diameter of the lead wires is 0.0125 mm.

FIGS. 3*a* and 3*b* show an example of the present invention as applied to a transistor with three strip-shaped electrodes. In the embodiments of FIGS. 4*a* and 4*b*, a ring-base transistor incorporating the invention is shown. In FIGS. 3*a* and 3*b*, and in FIGS. 4*a* and 4*b*, like numerals indicate corresponding parts as in FIGURES 2*a* and 2*b*, and the former structures are identical with the latter in the manufacturing process and method employed, and therefore detailed explanations of the structures and manufacturing process is not duplicated here.

Such an embodiment as shown in FIG. 3 is applicable to transistors for extended high frequency use, where the method of the invention proves most effective as this construction particularly facilitates substantial reduction of the dimensions of the base electrode 4 and the emitter electrode 5.

The present invention not only facilitates connection of electrodes of very small semiconductor elements with lead wires, but is applicable to semiconductor devices consisting of complicated elements, such as for example solid circuits, and therefore is extremely useful in a number of various applications.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. The method of making a semiconductor device which comprises the steps of forming first and second regions in a semiconductor material, forming a soft metal electrode on one of said regions and another electrode on the other of said regions, providing a layer of insulating material over said electrodes and the surface of said semiconductor material adjacent thereto, providing a plurality of thin conductive layers separated from one another on the surface of said insulating layer so that at least a portion of each conductive layer overlies a different electrode, pressing a sharp tool against one of said conductive layers to pierce the insulating layer in the region between said one layer and the electrode associated therewith and to pass a portion of said one layer through the resulting rupture in said insulating layer and also to deform said latter mentioned electrode to make a permanent electrical connection between said latter mentioned electrode and said one layer, and pressing a sharp tool against the other of said conductive layers to pierce the insulating layer in the region between said other layer and the electrode associated therewith and to pass a portion of said other layer through the resulting latter rupture in said insulating layer and also to deform said latter mentioned electrode to make a permanent electrical connection between said latter mentioned electrode and said other layer.

2. The invention described in claim 1 which includes the further step of connecting a wire lead to each of said conductive layers.

3. The invention described in claim 1 which includes the further step of heating said device to form a more reliable electrical connection between each of said conductive layers and the electrode associated therewith.

References Cited by the Examiner

UNITED STATES PATENTS

| | | | |
|---|---|---|---|
| 2,680,220 | 5/1954 | Starr et al. | 317—235 |
| 2,899,344 | 8/1959 | Atalla et al. | 317—235 X |
| 2,977,672 | 4/1961 | Telfer | 29—155.5 |
| 3,006,067 | 10/1961 | Anderson et al. | 317—235 X |
| 3,191,070 | 6/1965 | Jones et al. | 307—88.5 |
| 3,200,468 | 8/1965 | Dahlberg | 29—25.3 |

JOHN W. HUCKERT, *Primary Examiner.*

A. M. LESNIAK, *Assistant Examiner.*